United States Patent [19]

Hayase et al.

[11] Patent Number: 5,702,776
[45] Date of Patent: Dec. 30, 1997

[54] ORGANIC POLYSILANE COMPOSITION, COLORED MATERIAL, METHOD OF MANUFACTURING COLORED MATERIAL AND LIQUID CRYSTAL DISPLAY

[75] Inventors: Shuzi Hayase, Yokohama; Yoshihiko Nakano, Tokyo; Rikako Kani, Yokohama, all of Japan

[73] Assignee: Kabushiki Kaisha Toshiba, Kawasaki, Japan

[21] Appl. No.: 612,580

[22] Filed: Mar. 8, 1996

[30] Foreign Application Priority Data

Mar. 13, 1995 [JP] Japan ................................ 7-052141
Dec. 26, 1995 [JP] Japan ................................ 7-338943

[51] Int. Cl.$^6$ ............................ G02F 1/1335; G03F 9/00
[52] U.S. Cl. ............................ 428/1; 349/108; 430/7; 430/293; 430/321
[58] Field of Search ............................ 428/1; 359/66–68; 430/7, 293, 321

[56] References Cited

FOREIGN PATENT DOCUMENTS 5-188215   7/1993   Japan .
5-273410  10/1993   Japan .

*Primary Examiner*—Alexander Thomas
*Attorney, Agent, or Firm*—Oblon, Spivak, McClelland, Maier & Neustadt, P.C.

[57] ABSTRACT

A method of manufacturing a colored material wherein ultraviolet rays are irradiated onto an organic silicon compound film having any one of repeating units represented by the following general formulas (1) to (3), and then the film is heat-dried to turn the film into a three-dimensional structure. This process is repeated for each of R, G and B. As a result, a color filter provided with a color layer comprising a three-dimensional structure composed of silicon atom having one Si—C bond and formed through Si—O—Si bonds, and having a plurality of regions containing three different colors of R, G and B are contained therein can be manufactured.

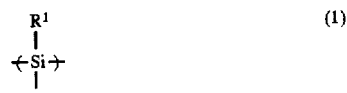

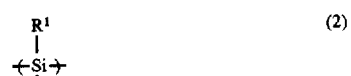

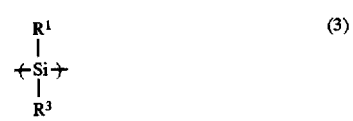

wherein $R^1$ is a substituted or non-substituted hydrocarbon group, $R^2$ is a substituted or non-substituted hydrocarbon group or acyl group, and $R^3$ is a substituted or non-substituted silyl group or polysilane skeleton.

16 Claims, 2 Drawing Sheets

ORGANIC POLYSILANE COMPOSITION, COLORED MATERIAL, METHOD OF MANUFACTURING COLORED MATERIAL AND LIQUID CRYSTAL DISPLAY

BACKGROUND OF THE INVENTION

1. Field of the Invention

This invention relates to an organic polysilane composition, a colored material such as a color filter, a method of manufacturing a colored material, and a liquid crystal display provided with a color filter.

2. Description of the Related Art

A liquid crystal display has been extensively employed for the preparation of a small-sized flat panel display, an electronic calculator, a watch, a display for use in a car, or a display for use in a personal computer. Furthermore, a liquid crystal display for animation is also commercially produced as typically represented by a small-sized liquid crystal television. On the other hand, there has been recently an increasing demand for a full color display, so that the development of a color filter, which is one of the main parts for a full color display, is also actively pursued.

The color filter mentioned above has been generally manufactured by the steps of coating a negative-type resist film containing a specific color component on a substrate, irradiating a patterned light on the negative-type resist film so as to selectively cure a prescribed region of the negative-type resist film, and then removing a non-cured portion of the negative-type resist film through a developing process. This process is repeated for each of three colors; red (R), green (G) and blue (B) to obtain the color filter.

However, since three kinds of resist are required for obtaining R, G and B, and moreover the steps comprising a film coating, light exposure and development are required to be repeated three times for each color according to this conventional method, the number of process is inevitably increased, thus making the manufacturing process very complicated.

There has been recently reported a method of selectively coloring an organic polysilane film wherein the organic polysilane film is selectively irradiated with ultraviolet rays and then immersed in a solution of dyestuff, whereby causing the irradiated portions of the organic polysilane film that have been photo-oxidized to be selectively colored (Yokoyama et al, Chemistry Letters, 1563–1566, 1991). There has been also proposed to prepare a color filter by making the most of this phenomenon as disclosed for example in Japanese Patent Unexamined Publication Hei/5-188215. According to this method, a film of an organic polysilane represented by the following general formula (4) is formed on a substrate, and then the steps of a selective irradiation by ultraviolet rays and the immersion of the film into a dyestuff solution are repeated for each of three color, R, G and B, thereby manufacturing a color filter.

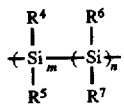

(4)

wherein $R^4$, $R^5$, $R^6$ and $R^7$ may be the same or different and are individually substituted or non-substituted hydrocarbon group; and m and n are integers.

According to this method for manufacturing a color filter, a step of development can be totally omitted and it is not required to repeat the step of forming a film. Therefore, it is possible to simplify the process of manufacturing a color filter as compared with the conventional method of employing a negative-type resist film containing a color component. Moreover, since the film-formation for each of three colors, red, green and blue can be performed en bloc, the surface of resultant color layer is flat, making it possible to manufacture a highly refined color filter. However, the organic polysilane represented by the above-mentioned general formula is slow in dyestuff-adsorbing velocity at an ultraviolet irradiated portion, hence taking a long period of time for fully coloring the ultraviolet-irradiated portion. Furthermore, the durability and mechanical strength of the resultant colored portion are relatively poor. As explained above, the conventional method of manufacturing a color filter wherein a color layer is formed through steps of film-forming, light-exposure and development of a negative-type resist film containing a color component is complicated in manufacturing process so that development of a method which enables the simplification of the manufacturing process of a color filter is highly demanded. As for the method of using a specific kind of organic polysilane instead of the above-mentioned negative-type resist film and selectively coloring an ultraviolet-irradiated portion of the organic polysilane thus permitting the omission of development step, there are problems that it takes a long period of time for sufficiently coloring an ultraviolet-irradiated portion of the organic polysilane and that the durability and mechanical strength of the resultant colored portion are relatively poor.

SUMMARY OF THE INVENTION

Accordingly, an object of the present invention is to solve the problems mentioned above, and to provide a colored material such as a color filter of highly refined quality which can be manufactured in a simple process and whose colored layer is excellent in durability as well as in mechanical strength.

Another object of this invention is to provide an organic polysilane composition which enables the manufacture of a colored material excellent in durability and mechanical strength in a simple manufacturing process.

In order to achieve the above objects, there is provided according to this invention a colored material provided with a colored layer comprising a silicon-based matrix mainly composed of a photooxidized organic polysilane and containing a coloring component wherein the number of silicon atom bonded through only one of its bonds to an organic residual group is 5 atomic % or more based on total number of silicon atoms existing in the silicon-based matrix.

In other words, according to the colored material of this invention, the inclusion of color components in the silicon-based matrix of three-dimensional structure of Si—O—Si bond is effected by the silicon atom having only one Si—C bond thereby forming a colored layer.

According to this invention, there is further provided with a method of manufacturing a colored material which comprises the steps of: forming a film of an organic silicon compound mainly comprising organic polysilane containing 5% or more of any one of repeating units represented by the following general formulas (1) to (3); exposing a prescribed portion of the organic silicon compound film to an irradiation of ultraviolet rays; coloring the irradiated portion of the organic silicon compound film by immersing the organic silicon compound film in a solution containing a color component; and turning the colored portion of the organic silicon compound film into a three-dimensional structure by heat-drying.

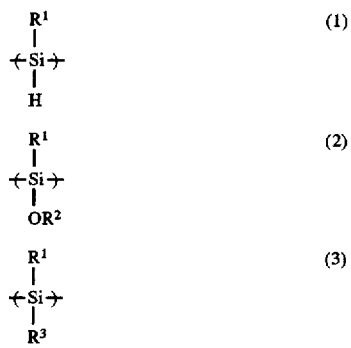

wherein $R^1$ is a substituted or non-substituted hydrocarbon group; $R^2$ is a substituted or non-substituted hydrocarbon group or acyl group; and $R^3$ is a substituted or non-substituted silyl group or polysilane skeleton.

There is further provided according to this invention a liquid crystal display which comprises: a pair of transparent substrates facing to each other; a pair of transparent electrodes, each disposed on a main surface of each of the transparent substrates so as to face each other; a liquid crystal filled between the pair of transparent substrates with each of the electrodes interposed therebetween; and a color filter interposed between one of the transparent substrate and the transparent electrode formed on the main surface of the one of the transparent substrate; wherein the color filter is formed of a colored material provided with a colored layer comprising a silicon-based matrix mainly composed of a photooxidized organic polysilane and containing a coloring component, the silicon-based matrix containing 5 atomic % or more, based on total number of silicon atoms existing in the silicon-based matrix, of silicon atom bonded through only one of its bonds to an organic residual group.

There is further provided according to this invention an organic polysilane composition comprising an organic polysilane having a repeating unit represented by the general formula (1) mentioned above and a radical-generating agent.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1A:
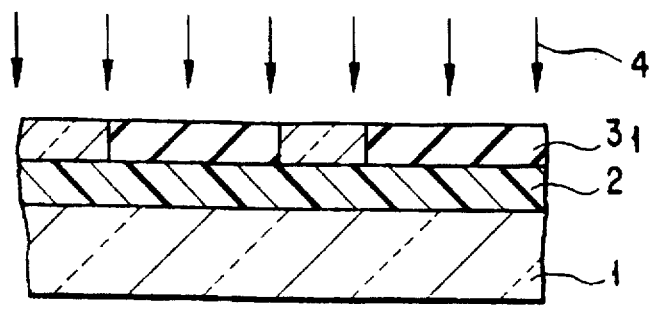
FIGS. 1A to 1F are sectional views illustrating a process of forming a multicolored layer in a method of manufacturing a colored material of this invention.

This invention will be further explained with reference to the following preferred embodiments. The film of organic polysilane to be used in this invention and comprising any one of repeating units represented by the above-mentioned general formulas (1) to (3) can be selectively colored as in the case of an organic polysilane represented by the general formula (4) by exposing a predetermined region of the polysilane film to an irradiation of ultraviolet rays, and then immersing the polysilane film in a solution containing a color component whereby coloring the ultraviolet ray-irradiated region. Namely, when an organic polysilane absorbs an energy of ultraviolet rays, the Si—Si bond therein is generally cut off and then oxidized by absorbing oxygen and moisture in the air atmosphere, thereby forming a couple of silanolic hydroxyl groups per silicon atom. Accordingly, an interaction between the silanolic hydroxyl group and the color component in the coloring solution is caused to generate at the ultraviolet ray-irradiated portion of the organic polysilane film, thus permitting the color component to be adhered onto the ultraviolet ray-irradiated region.

Moreover, the organic polysilane to be used in this invention and comprising any one of repeating units represented by the above-mentioned general formulas (1) to (3) is featured in that the hydrogen atom, alkoxyl group, acyloxyl group or silyl group which is directly bonded to silicon atom as a side chain group is also turned into a silanolic hydroxyl group. As a result, the sensitivity to ultraviolet rays of the organic polysilane can be enhanced, and at the same time, due to the formation in this manner of three silanolic hydroxyl groups per silicon atom, the adsorption velocity to be attained by the color component can be remarkably promoted thus making it possible to greatly shorten the time required for the coloring of the polysilane film.

Since three silanolic hydroxyl groups can be generated per one silicon atom in the repeating unit upon the irradiation of ultraviolet rays onto the organic polysilane to be used in this invention, a silicon matrix of three-dimensional structure composed of Si—O—Si bonds, i.e. a photooxidized organic polysilane, is constructed as such that only one bond out of four bonds of the silicon atom is bonded to an organic residual group and the remaining three bonds are offered to the Si—O—Si bonds. Namely, it is possible to form a silicon-based matrix of three-dimensional structure composed of Si—O—Si bonds with silicon atoms, each having a single Si—C bond, thus enhancing the durability and mechanical strength of a colored layer which is formed of silicon-based matrix containing a color component. The reason of enhancement of the durability and mechanical strength of a colored layer as the silicon-based matrix is formed with silicon atoms having respectively a single Si—C bond can be explained as follows. Namely, if the silicon atom has two or more of Si—C bonds, it is impossible to obtain a three-dimensional structure composed of Si—O—Si bonds. Whereas, if the silicon atom does not have any Si—C bond, but all of four bonds are offered to Si—O—Si bond, the flexibility of the resultant silicon-based matrix will be deteriorated.

The colored layer in the colored material according to this invention may contain a silicon atom having more than one Si—C bond, provided that the number of silicon atom bonded through only one of its bonds to an organic residual group is 5 atomic % or more, preferably 25 atomic % or more, more preferably 50 atomic % or more based on total number of silicon atoms existing in the silicon-based matrix of three-dimensional structure composed of Si—O—Si bonds. The measuring of the number of Si—C bond around a silicon atom in the silicon-based matrix can be performed by dissolving, preferably under heating, the colored layer in an alkaline solution such as 10 wt. % aqueous solution of NaOH, turning the aqueous solution into a weak acidic solution, and, after the separation and extraction of silicic components from color components with ether, analyzing the silicic components with a high speed liquid chromatography or a gas chromatography. More specifically, the kind of organic residual group bonded to silicon atom is identified at first with NMR for example, and then silanol having 0 to 4 bonds bonded to the same kind of organic residual group as identified above are employed as standard samples to perform an analysis. On the other hand, a solution of silanol obtained by dissolving the colored layer is analyzed and the results obtained are compared with the analyzed results of the standard samples. Alternatively, the surface of the colored layer may be directly analyzed using IR or XPS. In any case, the number of silicon atom having only one Si—C bond in the silicon-based matrix can be quantitatively analyzed by measuring the integrated value of the peak in the chromatography or of the peak of the spectrum.

It is also possible according to this invention that three remaining bonds of the above-mentioned silicon atom having one Si—C bond may not be offered to the Si—O—Si bond. For example, the Si—Si bond in the backbone chain of the organic polysilane may be more or less remained as they are. Further, the colored layer according to this invention is not restricted to the silicon-based matrix that has been formed through the photo-oxidation of an organic polysilane. Namely, it is also possible with other kind of matrix to obtain a colored layer having an enhanced durability and mechanical strength as far as the number of silicon atom having one Si—C bond is 5 atomic % or more based on total number of silicon atoms existing in the silicon-based matrix of three-dimensional structure composed of Si—O—Si bonds.

Likewise, with respect to organic polysilane having any one of repeating units represented by the general formulas (1) to (3) that will be used in this invention, the organic polysilane may not be composed of homopolymer consisting only of these repeating units. The organic polysilane may be a copolymer with another repeating unit such as represented by the following general formula (5) as far as the copolymer is soluble in an organic solvent and capable of forming a more or less transparent uniform film. However, if the content of repeating units represented by the general formulas (1) to (3) is too small, the adsorption velocity of color component at the coloring step may become too slow, and the durability and mechanical strength of the resultant colored layer may also be deteriorated. Therefore, the content of repeating units represented by the general formulas (1) to (3) should be 5% or more, preferably 25% or more, most preferably 50% or more.

(5)

wherein $R^8$ and $R^9$ may be the same or different and are individually substituted or non-substituted hydrocarbon group.

The hydrocarbon group represented by $R^1$, $R^2$, $R^8$ and $R^9$ in the general formulas (1) to (3) and (5) may be aliphatic hydrocarbon groups, alicyclic hydrocarbon groups or aromatic hydrocarbon groups. Specific examples of them are phenyl group, naphthyl group, anthranil group, phenanthryl group, biphenyl group and alkyl group. These groups may be substituted by a characteristic group having halogen atoms, ether bond, thioether bond or ester bond, or by a hydrophilic group such as hydroxyl group, thiol group or carboxylic group. On the other hand, with regard to $R^2$ in the general formula (2), it may be an ordinary group such as methyl or ethyl, but in view of storage stability it should more preferably be isopropyl group or tertiary butyl group. Further, these organic polysilane may be a linear polymer, but should preferably be an organic polysilane comprising a repeating unit wherein $R^3$ in the general formula (3) is polysilane skeleton. Because, since the backbone chain thereof is formed of a partially cross-linked network polymer formed through Si—Si bonds, the elution of film during the immersion of the polysilane film in a solution containing a color component in the coloring step after the film-formation and light exposure can be preferably inhibited.

Followings are preferred examples of organic polysilane to be employed in this invention.

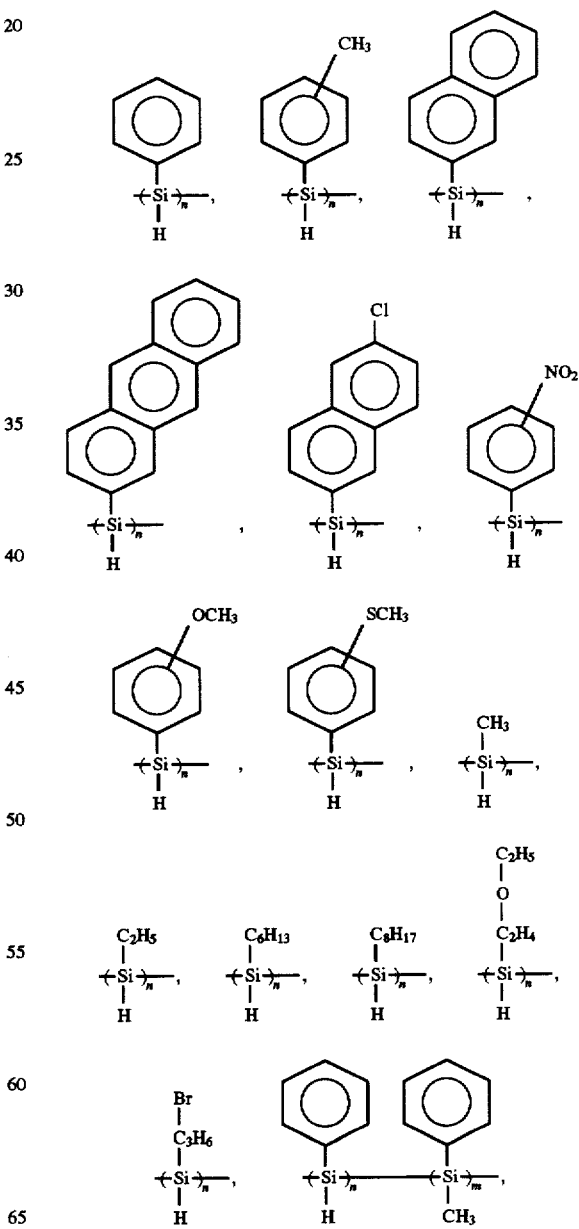

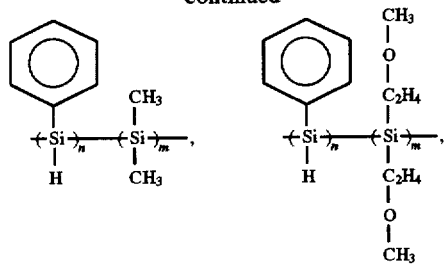
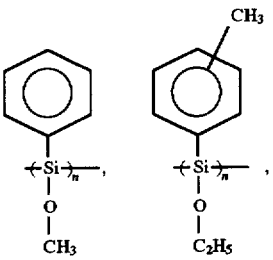

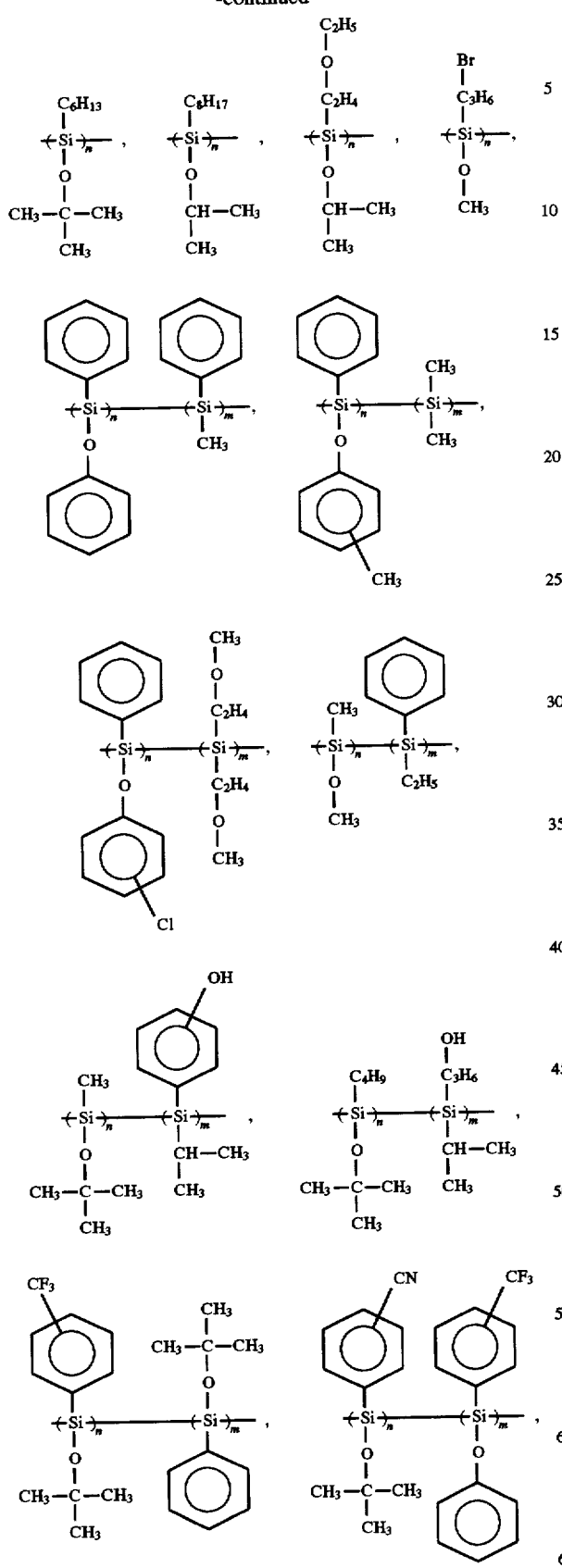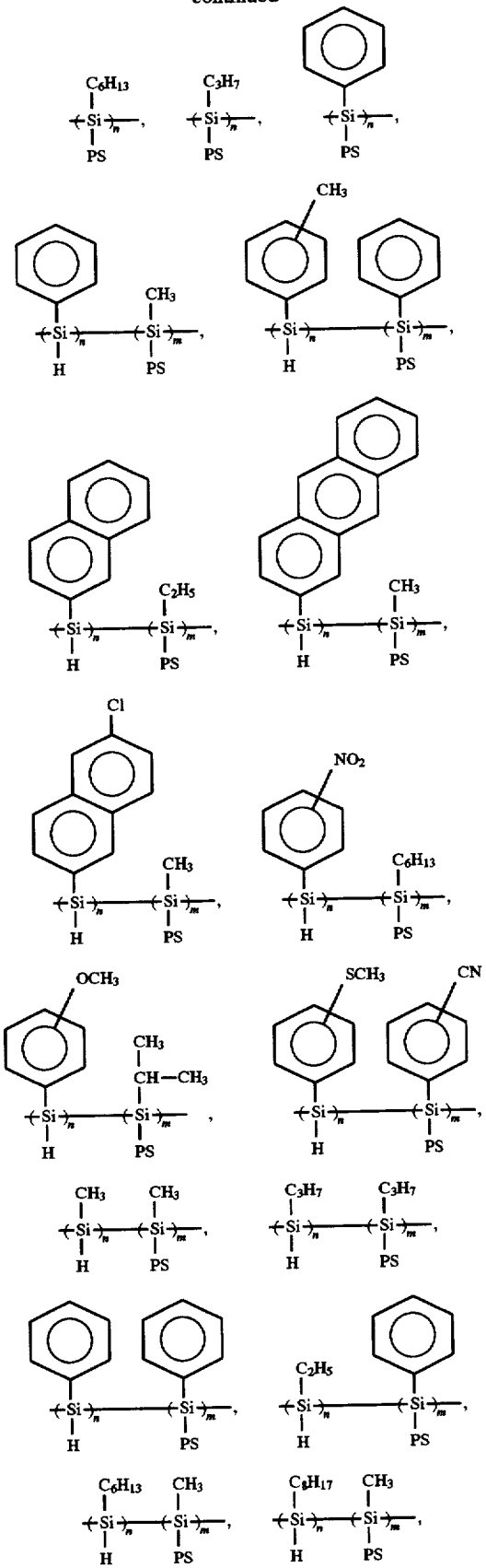

-continued
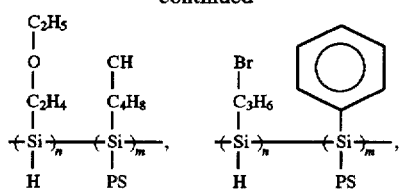
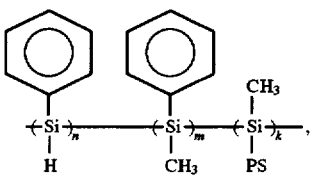
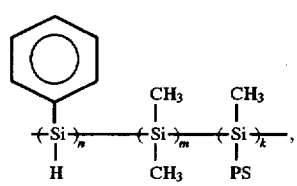
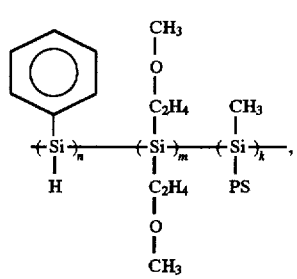
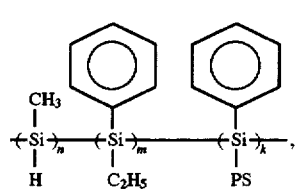
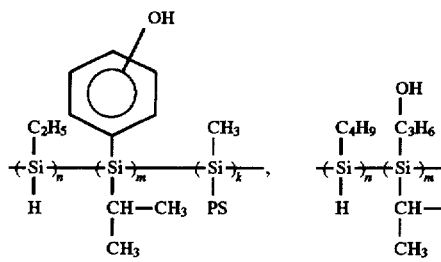
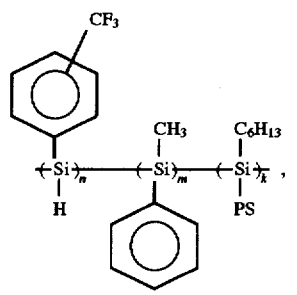
-continued
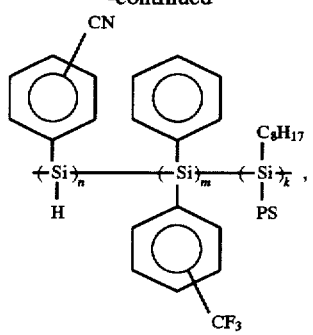
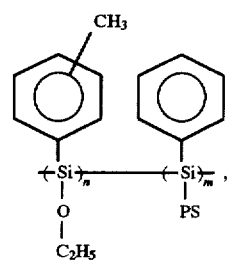
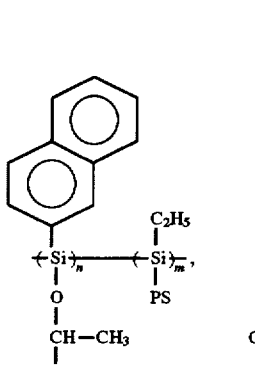
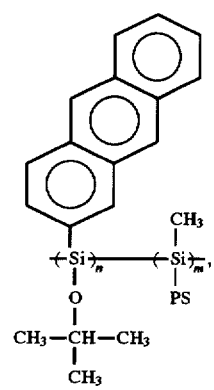
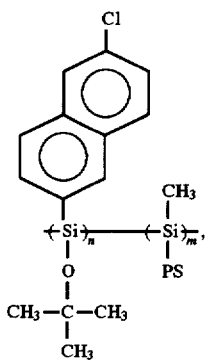
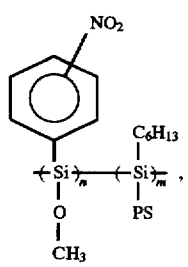
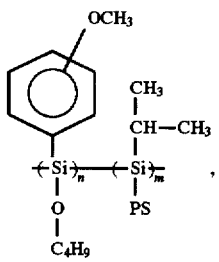

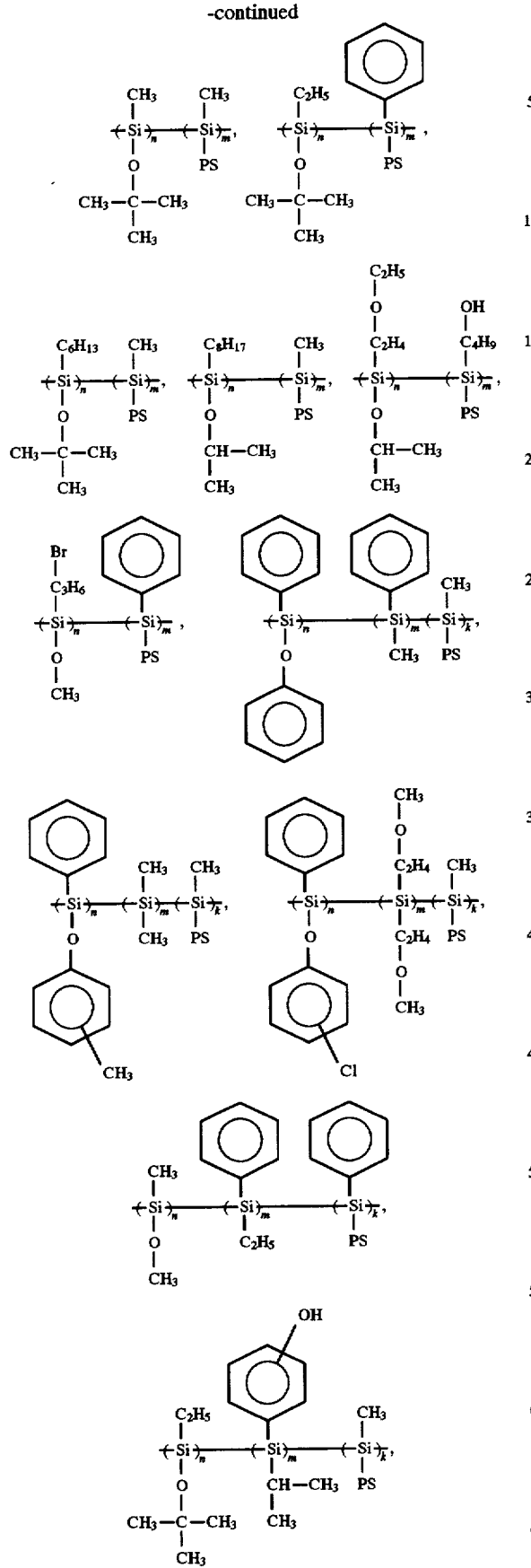
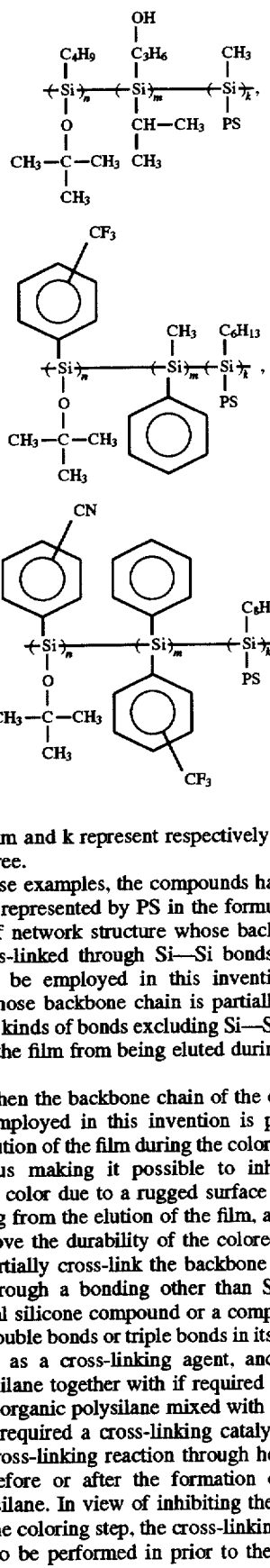

wherein n, m and k represent respectively a polymerization degree.

Among these examples, the compounds having a polysilane skeleton represented by PS in the formula are organic polysilanes of network structure whose backbone chain is partially cross-linked through Si—Si bonds. The organic polysilane to be employed in this invention may be a compound whose backbone chain is partially cross-linked through other kinds of bonds excluding Si—Si bond in view of inhibiting the film from being eluted during the coloring step.

Namely, when the backbone chain of the organic polysilane to be employed in this invention is partially cross-linked, the elution of the film during the coloring step can be inhibited, thus making it possible to inhibit the non-uniformity in color due to a rugged surface of the colored layer resulting from the elution of the film, and at the same time to improve the durability of the colored layer. If it is desired to partially cross-link the backbone of the organic polysilane through a bonding other than Si—Si bond, a polyfunctional silicone compound or a compound having a plurality of double bonds or triple bonds in its molecule may be employed as a cross-linking agent, and mixed in an organic polysilane together with if required a cross-linking catalyst. The organic polysilane mixed with a cross-linking agent and if required a cross-linking catalyst is then subjected to a cross-linking reaction through heating or light-irradiation before or after the formation of film of the organic polysilane. In view of inhibiting the elution of the film during the coloring step, the cross-linking reaction may be required to be performed in prior to the coloring step.

However, if only the durability of the colored layer is desired, the cross-linking reaction may be performed after the coloring step.

The organic polysilane to be employed in this invention is desired to have a weight-average molecular weight ranging from 2,000 to 100,000,000. If the weight-average molecular weight of the organic polysilane is less than 2,000, the film thereof may be partially dissolved into a solution containing a color component during the coloring step in subsequent to the film formation, thereby deteriorating the flatness of the surface of the color layer. On the other hand, if the weight-average molecular weight of the organic polysilane exceeds over 100,000,000, the solubility into a solvent of the organic polysilane will be deteriorated, making it difficult to be formed into a film.

The organic polysilane having the above-mentioned features can be directly synthesized by a reductive coupling reaction or an electrolytic polymerization of $R^1SiHCl_2$, $R^1Si(OR^2)Cl_2$ or $R^1SiCl_3$. The organic polysilane may be a copolymer as mentioned above, which can be synthesized for example by a reductive coupling reaction of the above-mentioned compounds together with $R^8R^9SiCl_2$. Further, in view of controlling the polymerization degree of the organic polysilane, the copolymerization reaction may be performed together with $R^1SiHACl$ or $R^1Si(OR^2)ACl$ (wherein A represents a terminal group). However, if the organic polysilane is synthesized through a reductive coupling reaction, sodium-based catalyst may remain as an ionic impurity in the resultant organic polysilane, so that if a colored material produced from this organic polysilane and a color component is applied to a color filter of a liquid crystal display, the performance of the display element may be deteriorated.

As for the organic polysilanes having any of repeating units represented by the above-mentioned general formulas (1) to (3), they can be directly synthesized by the de-hydrogenation reaction of $R^1SiH_3$ in the presence of titanium or zirconium catalyst. If a carbonyl compound is radically added to the organic polysilane prepared in this manner and having a repeating unit represented by the general formula (1), an organic polysilane having a repeating unit represented by the general formula (2) can be synthesized. Furthermore, if such an organic polysilane is heat-treated at a high temperature, an organic polysilane having a repeating unit represented by the general formula (3) can be synthesized. A network polymer wherein the backbone chain thereof is partially cross-linked through Si—Si bonds such as the organic polysilane having a repeating unit represented by the general formula (3) may also be synthesized by mixing as a catalyst an acidic or basic compound, or a compound capable of generating as a trigger an acidic or basic compound upon being heated or exposed to a light irradiation with a linear unidimensional polymer, thereby allowing the cross-linking of the linear unidimensional polymer to proceed by making use of these catalysts.

The organic polysilane that can be synthesized through a dehydrogenation reaction by making use of a zirconium catalyst is not only free from ionic impurities, but also free from the generation of silanolic hydroxide that might be bonded to a silicon atom at the terminal portion of the polymer. Therefore, it is possible to effectively prevent a color component in a coloring solution from being adhered onto a region other than the ultraviolet-irradiated portion of the organic polysilane in the coloring step in subsequent to the steps of film-formation and light exposure. Among them, the organic polysilane represented by the following general formula (6) which can be synthesized through a dehydrogenation reaction by making use of a zirconium catalyst is advantageous in terms of simplicity of industrial synthesizing process and in economic view point.

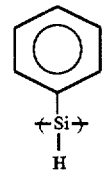

(6)

wherein n represents a polymerization degree.

The above-mentioned organic polysilanes having any of repeating units represented by the above-mentioned general formulas (1) to (3) can be employed as a solution by simply dissolving them in an organic solvent in the step of film formation. However, this invention is not limited to this method.

For example, as one embodiment of manufacturing a colored material according to this invention, the organic polysilane having a repeating unit represented by the general formula (1) may be dissolved together with a radical-generating agent in an organic solvent and the resultant solution of an organic polysilane composition may be employed for forming an organic silicon compound film. In this case, the organic polysilane composition may contain an organic compound having at least two unsaturated bonds in the molecule thereof.

The method of manufacturing a colored material by making use of such an organic polysilane composition will be explained as follows. At first, an organic polysilane having a repeating unit represented by the following general formula (7) may be preferably employed. If an organic polysilane having a repeating unit represented by the general formula (1) where $R^1$ is alkyl group is employed, the cross-linking of the backbone chain thereof may proceed excessively during the step of forming a film of organic silicon compound, resulting in the deterioration of sensitivity to ultraviolet rays of the resultant silicon compound film.

(7)

wherein Ar is substituted or non-substituted phenyl, naphthyl, phenanthryl or anthranil group.

As for the examples of the radical-generating agent to be mixed with these organic polysilane, azobis (isobutyronitrile) (AIBN), cumylperoxide, benzoylperoxide, triphenyl cylylbutylperoxide and trimethylcylylperoxide may be employed. A compound having an unsaturated bond is a compound which is capable of radically reacting with Si—H bond, examples thereof being compounds having any one of acryl, methacryl, vinyl, acetyl and carbonyl groups. Specific examples of such a compound are polybutadiene, diacryl phthalate, ethylene glycol dimethacrylate, trimethylol propane trimethacrylate, triethylene glycol dimethacrylate, methapenillene bismaleimide, triallylcyanurate, methacrylic epoxy resin, trifluoroethyl methacrylate and $CHO(CH_2)_4 CHO$.

A solution of organic polysilane composition comprising these organic polysilane and radical-generating agent or further including, if required, an organic compound containing a plurality of unsaturated bonds is coated on a substrate, and then dried under heating whereby partially cross-linking the organic polysilane in the coated film. The resultant film is further subjected to an exposure to the irradiation of ultraviolet rays, an immersion into a solution containing a color component and a heat treatment for turning it into a stable three dimensional structure, thus preparing a color material of this invention.

If an organic polysilane having a repeating unit represented by the general formula (1) is singly employed, the organic polysilane may be excessively depolymerized at the ultraviolet-irradiation step, thereby inviting the deterioration of film quality, thus giving rise to problem of elution of the film during the coloring step. However, according to this invention, this problem can be avoided as explained above. Namely, since the organic polysilane composition to be employed in this invention contains a radical-generating agent, when the film of this organic polysilane composition is heated after the film formation, hydrogen radical is pulled out from Si—H bond to generate a Si-radical. Therefore, oxygen or moisture in the air atmosphere is taken up by the Si-radical thereby allowing the backbone chain to be partially cross-linked through Si—O—Si bonds, or the Si-radical is directly reacted to each other causing the backbone chain to be partially cross-linked through Si—Si bonds. On the other hand, when an organic compound having a plurality of unsaturated bond is mixed with the organic polysilane, the Si-radical is caused to attach to the unsaturated bond, thus turning the organic compound into a cross-linking agent and causing the backbone of the organic polysilane to be partially cross-linked through this organic compound. Therefore, even if the organic polysilane is more or less depolymerized due to the irradiation of ultraviolet rays, the quality of the film would not be deteriorated so much, and as a matter of fact, the durability and mechanical strength of the colored layer can be improved and at the same time the non-uniformity of color can be inhibited by this partial cross-linking. When the organic polysilane is partially cross-linked before the formation of film, the organic polysilane may be insolubilized or the precipitation of a gel-like material would be caused. However, if the organic polysilane is partially cross-linked through heating after the formation of film, the inconvenience as mentioned above can be avoided. This reaction in a solution is reported by M. Waymouth et al in J. Am. Chem. Soc., 1994, 116, 9779–9780.

Moreover, since the organic polysilane partially cross-linked in this manner still has hydrogen atom bonded directly to silicon atom as a side chain even after the partial cross-linking, the hydrogen atom is caused to change into silanolic hydroxyl group upon being irradiated with ultraviolet rays as in the case of employing only an organic polysilane having any of repeating units represented by the general formulas (1) to (3). Therefore, since this partially cross-linked organic polysilane is still highly sensitive to ultraviolet rays and is capable of generating three silanolic hydroxyl groups per silicon atom of Si-H bond whose hydrogen radical is kept remained without being pulled out, the adhesion velocity of color component onto the organic polysilane film can be extremely promoted thus greatly shortening the time required for the coloring of the film.

With respect to organic polysilane having a repeating units represented by the general formula (7) that will be used in this invention, the organic polysilane may not be composed of homopolymer consisting only of this repeating unit. For example, the organic polysilane may be a copolymer with another repeating unit such as represented by the following general formula (8) as far as the copolymer is soluble in an organic solvent and capable of forming a more or less transparent uniform film. However, if the content of repeating unit represented by the general formula (7) is too small, the adsorption velocity of color component at the coloring step may become too slow, and the durability and mechanical strength of the resultant colored layer may also be deteriorated. Therefore, the content of repeating unit represented by the general formula (7) should be 5% or more, preferably 25% or more.

wherein $R^{10}$ and $R^{11}$ may be the same or different and are individually substituted or non-substituted hydrocarbon group.

In this invention, the organic polysilane having a repeating unit represented by the general formula (1) is mixed with a radical-generating agent and further with an organic compound containing a plurality of unsaturated bonds, and then the backbone chain thereof is partially cross-linked prior to the coloring step thereby effectively inhibiting the elution of the film during the coloring step as mentioned above. Therefore, it is possible to inhibit the non-uniformity of color due to a rugged surface of a colored layer and to improve the durability of the colored layer.

In the colored material of this invention, the color component to be introduced into the silicon-based matrix mainly consisting of the photooxidized organic polysilane may be any of a basic dye, an oil soluble dye, a disperse dye or a pigment.

Specific C.I. Nos. of these dyestuffs and pigments will be shown below. Namely, the examples of the dyestuffs are basic dyestuffs such Basic Red 12, Basic Red 22, Basic Violet 7, Basic Violet 10, Basic Violet 40, Basic Blue 1, Basic Blue 7, Basic Blue 26, Basic Blue 77, Basic Green 1 and Basic Yellow; oil soluble dyestuffs such as Solvent Red 125, Solvent Red 132, Solvent Red 83, Solvent Red 109, Solvent Blue 67, Solvent Blue 25, Solvent Yellow 25, Solvent Yellow 89 and Solvent Yellow 146; and disperse dyestuffs such as Disperse Red 60, Disperse Red 72, Disperse Blue 56, Disperse Blue 60 and Disperse Yellow 60. The examples of the pigments are Pigment Red 220, Pigment Red 221, Pigment Red 53:1, Pigment Blue 15:3, Pigment Blue 60, Pigment Green 7 and Pigment Violet 37.

The solvent to be used for preparing a solution containing a color component may be water or alcohol. The concentration of color component in the solution should preferably be 1 to 10 wt. % or so. If the concentration of color component in the solution is less than 1 wt. %, it is difficult to obtain a sufficiently colored layer. On the other hand, if the concentration of color component exceeds over 10 wt. %, non-uniformity in color may be caused in the resultant colored layer.

It is also possible to employ a sol (colloidal) solution of a metal alkoxide or the decomposition product of a metal alkoxide for mixing therein a color component thereby preparing a colored sol. In this case, the metal alkoxide may be an alkoxide of metalloid. For example, an ethoxide of silicon, aluminum, zirconium or titanium is dissolved or dispersed in a mixed solution of alcohol and water, and then an acid is added to the resultant solution whereby forming a sol to which a color component is added to prepare a colored sol. The content of metal alkoxide can be suitably selected as far as the fluidity of the resultant solution can be assured. Specifically, the content of the metal alkoxide in the solvent should be about 70% or less.

If a predetermined region of an organic silicon compound film consisting mainly of an organic polysilane is irradiated with ultraviolet rays and then the coloring of ultraviolet-irradiated portion of an organic polysilane film is performed by immersing the film in the colored sol as mentioned above, it is possible to adhere a pigment which is insoluble to a solvent such as water or alcohol onto the organic polysilane film by dispersing the pigment in a colored sol, thus enlarging the choice of color component that can be employed. Moreover, the employment of colored sol is advantageous in the formation of multi-colored layer comprising a plurality of colors which are respectively adhered on different regions of an organic silicon compound film, since even if the organic silicon compound film partially colored already with one of color components is immersed in a solution containing a different color for the formation of the multi-colored layer, the color component adhered in advance onto the film would hardly be released into a solution containing the different color.

Furthermore, if a sol solution comprising silicon alkoxide or the decomposition product thereof is employed, the silicon alkoxide or the decomposition product is adhered together with a color component onto an organic silicon compound film, as the organic silicon compound film is immersed in the sol solution. When this organic silicon compound film is heat-dried, the silicon alkoxide or the decomposition product reacts with the silanolic hydroxyl group formed in advance by the irradiation of ultraviolet rays to the organic polysilane. Therefore, the silicon alkoxide or the decomposition product directly takes part as a cross-linking component in the formation of three-dimensional structure of Si—O—Si bonds thereby contributing to the improvement of durability of the colored layer of the colored material of this invention. In this case, a catalyst which promotes the reaction between the silicon alkoxide or the decomposition product and the silanolic hydroxyl group formed by the irradiation of ultraviolet rays to the organic polysilane may be mixed in advance in the sol solution.

It is also possible in this case to co-use a water-soluble organic solvent such as acetonitrile, dioxane or tetrahydrofuran for accelerating the adhesion speed of a color component in the coloring step. However, if this water-soluble organic solvent is to be co-used, the amount thereof should preferably be limited to 20 wt. % or less. Because, if the amount of the water-soluble organic solvent in the color solution is excessive, the elution of the film may more likely be promoted at the coloring step.

Therefore, for the purpose of promoting the adhesion speed of a color component at the coloring step by increasing the amount of the water-soluble organic solvent, it may be advantageous to employ a solution of an organic polysilane composition comprising an organic polysilane having a repeating unit represented by the above-mentioned general formula (1) and a radical-generating agent dissolved in the organic solvent, and to form a film of the organic polysilane compound wherein the backbone chain of the organic polysilane is partially cross-linked.

The sol solution comprising silicon alkoxide or the decomposition product thereof may be used without incorporating a color component therein for impregnating it in an organic silicon compound film after the steps of light-exposure and coloring of the organic silicon compound film, and before the film is heat-dried. In this case also, the silicon alkoxide or the decomposition product thereof acts as a cross-linking component and is taken up in the silicon-based matrix of three-dimensional structure of Si—O—Si bonds, thereby enabling a colored layer of excellent durability to be obtained.

The method of manufacturing a colored material according to this invention will be explained in the followings wherein organic polysilanes having any one of repeating units represented by the above-mentioned general formulas (1) to (3) are employed.

In the manufacture of a colored material according to this invention with the use of these organic polysilanes and color components, a solution containing an organic polysilane is prepared at first, and then the solution is coated on the surface of a transparent substrate made for example of transparent glass or resin. The resultant coated layer is then dried at a temperature of 50° to 150° C. to evaporate a solvent thereby forming an organic silicon compound film mainly composed of an organic polysilane. The solvent for the organic polysilane useful in this case may be toluene, xylene, methyl ethylketone, tetrahydrofuran, ethylacetate cellosolve, butyrolactone or butyl lactate.

To be more specific, a solution containing 1 to 50 wt. % of an organic polysilane is prepared and, after filtering the solution through filter of 0.1 µm in pore size if required, the solution is spin-coated on the surface of the transparent substrate. The film thickness of the organic silicon compound film to be formed on the substrate may preferably be 0.1 µm to 5 µm. Because, if the film thickness is less than 0.1 µm, the content of the color component in the color layer may be insufficient, whereas if the film thickness exceeds over 5 µm, it may become difficult to uniformly adhere the color component down to the lowermost region of the film during the coloring step.

Then, the organic silicon compound film formed on the transparent substrate is exposed through a mask having a prescribed pattern to an irradiation of ultraviolet rays by way of a high pressure mercury lamp, a xenon lamp or excimer laser. When the organic polysilane is irradiated with ultraviolet ray, it absorbs an energy of ultraviolet rays, resulting in the cut off of the Si—Si bond thereof and is oxidized by absorbing oxygen and moisture in the air atmosphere, and the hydrogen atom, alkoxy group, acyloxy group or silyl group which is directly bonded to silicon atom as a side chain group is turned into a silanolic hydroxyl group.

In this light exposure step, the wavelength of ultraviolet rays may be 150 to 400 nm. However, when ultraviolet rays 200 to 300 nm in wavelength is irradiated to the organic silicon compound film, it is possible to easily obtain a sufficiently tinted colored layer. The exposure dose of ultraviolet rays may be 10 mJ to 10 J, preferably 100 mJ to 3 J. If the irradiation dose exceeds over 10 J, it not only takes a longer period of light exposure time thus lowering the productivity, but also the generation of pin-hole would be caused thus deteriorating the quality of the film. On the other hand, if the irradiation dose is less than 10 mJ, the tinting of the ultraviolet-irradiated portion of the organic polysilane at the coloring step may become insufficient due to an insufficient light exposure.

Then, the organic silicon compound film is immersed in a solution containing a color component for 0.5 to 10 minutes at a temperature of 0° to 50° C. In this immersion of the organic silicon compound film, the color component is adhered onto the ultraviolet-irradiated portion of the organic silicon compound film where silanolic hydroxyl groups have been generated, thus selectively coloring the ultraviolet ray-irradiated portion. Subsequently, the resultant organic silicon compound film is heat-dried for 5 to 30 minutes at a temperature of 50° to 150° C. thereby to remove the solvent of the color component which has been impregnated in the organic silicon compound film, and at the same time a many number of silanolic hydroxyl groups generated during the light exposure are reacted with each other, resulting in the formation of a silicon-based matrix of three-dimensional structure of Si—O—Si bonds. Accordingly, a colored layer containing a color component in the silicon-based matrix and being excellent in durability and mechanical strength can be obtained. In prior to the heat-drying step following the immersion of the organic silicon compound film in a solution containing a color component, the solvent in the organic silicon compound film may be removed by way of washing with water or air blow.

If an organic polysilane composition comprising an organic polysilane having a repeating unit represented by the general formula (1), a radical-generating agent and if required an organic compound having an unsaturated bond is to be employed, the same process as explained above can be adopted except that a solution comprising these components dissolved in an organic solvent such as toluene is employed, thereby forming a colored material of this invention. In this case, the solution containing these components may be homogeneous or non-homogeneous solution. The content of organic polysilane in the solution should preferably be 1 to 50 wt. %. The content of any of the radical-generating agent and the organic compound having an unsaturated bond should preferably be 1 to 200 parts by weight, more preferably 5 to 100 parts be weight per 100 parts by weight of organic polysilane. If the content of any of these components is less than the lower limit, the partial cross-linking of the organic polysilane in the organic silicon compound film can not be sufficiently proceeded, whereas if the content of any of these components exceeds over the upper limit, the amount of hydrogen atoms directly bonded to silicon atom which have been left remained after the partial cross-linking of the organic polysilane is so small that the sensitivity of the film to ultraviolet rays may more likely be lowered.

According to the method of manufacturing a colored material of this invention, the processes of light-exposure and coloring mentioned above are repeated for each of three colors thereby forming a multi-colored layer. FIGS. 1A to 1F illustrate a manufacturing sequence of a multi-colored layer in the preparation of a colored material of this invention.

Figure 1B:
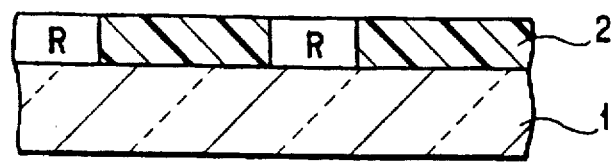

In this manufacturing process, a first region of an organic silicon compound film 2 formed on the surface of a transparent substrate 1 is exposed to an irradiation of ultraviolet rays 4 through a mask $3_1$ having a pattern which is reverse to the above-mentioned first region (FIG. 1A). Then, the organic silicon compound film 2 is immersed in a solution containing a first color component to color the first region (FIG. 1B).

Figure 1C:
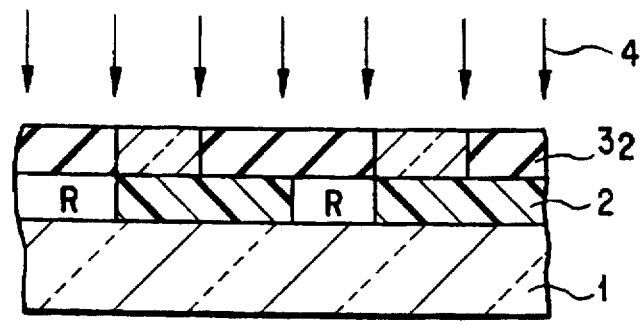
Figure 1D:
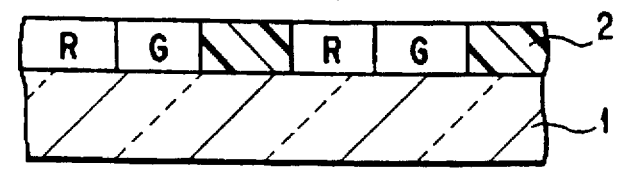

Then, after heat-drying the organic silicon compound film 2 if required, a second region of the organic silicon compound film 2 is exposed to an irradiation of ultraviolet rays 4 through a mask $3_2$ having a pattern which is reverse to the above-mentioned second region (FIG. 1C). Then, the organic silicon compound film 2 is immersed in a solution containing a second color component to color the second region (FIG. 1D). In this case, even if ultraviolet rays 4 is irradiated onto a region having already silanolic hydroxyl groups formed therein through an irradiation of ultraviolet rays in the prior step, any problem would be raised so that it is possible to employ a mask having a pattern which is reverse to a combined pattern of the first and second regions and to irradiate through this mask ultraviolet rays 4 onto the first and second regions.

Figure 1E:
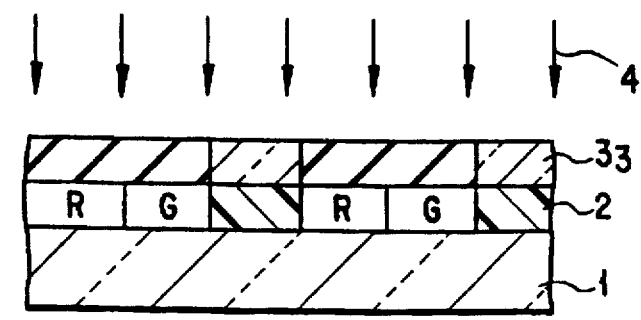
Figure 1F:
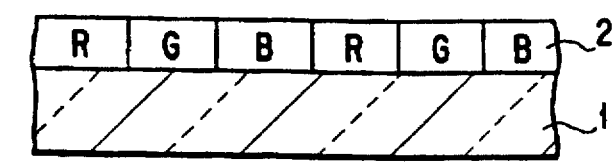

In the same manner as mentioned above, after heat-drying the organic silicon compound film 2 if required, a third region of the organic silicon compound film 2 is exposed to an irradiation of ultraviolet rays 4 through a mask $3_3$ having a pattern which is reverse to the above-mentioned third region (FIG. 1E). Then, the organic silicon compound film 2 is immersed in a solution containing a third color component to color the third region (FIG. 1F). In this case, it is also possible to employ a mask having a pattern which is reverse to a combined pattern of the first, second and third regions and to irradiate through this mask ultraviolet rays 4 onto all of the first, second and third regions.

When a plurality of color components are to be adhered onto a plurality of different regions of the organic silicon compound film thereby to form a multi-colored layer in this manner, the coloring of the organic silicon compound film should preferably be performed in the order of the adsorption velocity of color onto the film, i.e. at first with a color which is the fastest among all of the colors and then with a color which is the second fastest and so on. The reason for this is that the faster the adsorption velocity of the color component is, the more difficult the release of the color component once adsorbed in the film becomes, so that the step of turning the film into a three-dimension structure through heat-drying may be omitted or shortened. However, even if the coloring of the organic silicon compound film with a plurality of colors is performed in the order of the adsorption velocity of color, it is desirable that the steps of light-exposing, coloring and transforming into a three-dimensional structure of the film should be repeated in the manufacture of a colored material having a multi-colored layer in view of preventing the mixing of colors in the region where a color adsorption has been already performed.

As explained above, it is possible according to this invention to easily obtain a multi-colored layer comprising a plurality of colored regions colored with a plurality of different color components, such as a color filter provided with color layers of R, G and B. This color filter may also include a black matrix as a fourth region. Also in this case, the coloring of the color filter should preferably be performed in the order of the adsorption velocity of color in coloring a first to third regions representing R, G and B as well as a fourth region representing black matrix.

The color filter to be manufacturing in this process is advantageous in its flatness of the surface thereof, since a film for each of the color regions such as R, G and B can be formed en bloc. This process is particularly suited for preparing a liquid crystal display for use in a full color display.

Figure 2:
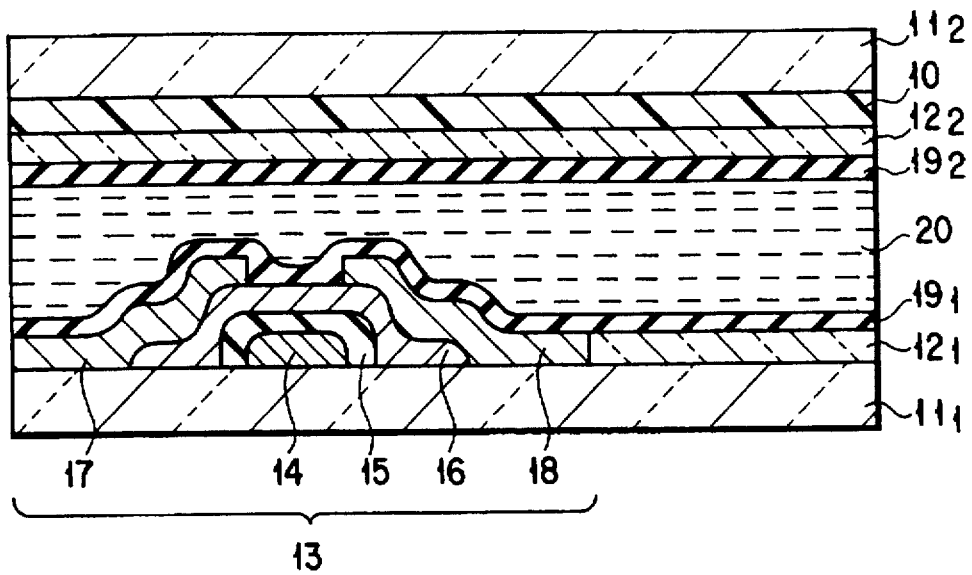
FIG. 2 is a vertical sectional view of a liquid 10 crystal display for use in a full color display.

FIG. 2 illustrates a vertical cross-sectional view of such a liquid crystal display of this invention. Referring to FIG. 2, reference numerals $11_1$ and $11_2$ represent a transparent substrate respectively. On the surfaces of these transparent substrates facing to each other, there are formed transparent electrodes $12_1$ and $12_2$ formed of ITO, respectively. The transparent substrate $11_2$ provided with the transparent electrode $12_2$ to be utilized as a scanning electrode functions as a color filter substrate with a color filter 10 provided with R, G and B being interposed between the transparent substrate $11_2$ and the transparent electrode $12_2$.

On the other hand, the transparent substrate $11_1$ provided with the transparent electrode $12_1$ functioning as a display electrode is furnished with a TFT 13 contacting with the transparent electrode $12_1$. In this TFT 13, a gate electrode 14 is formed on the transparent substrate $11_1$ and covered with a gate insulating film 15. On this gate insulating film 15 is formed a semiconductor layer 16 on which a source electrode 17 and a drain electrode 18 are contacted. A liquid crystal orientation film $19_1$ is formed on the surfaces of the transparent electrode $12_1$ and the TFT 13, and a liquid crystal orientation film $19_2$ is formed on the surface of the transparent electrode $12_2$ facing to the transparent electrode $12_1$. A liquid crystal 20 is sealed between the liquid crystal orientation films $19_1$ and $19_2$.

Figure 3:
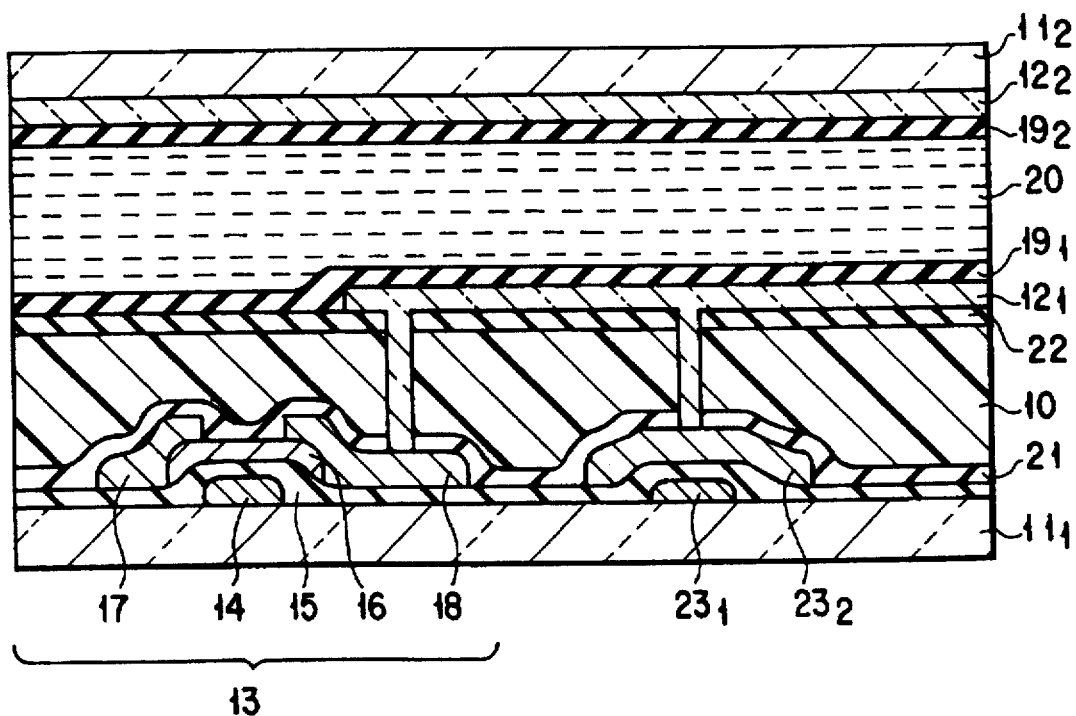
FIG. 3 is a vertical sectional view of another liquid crystal display for use in a full color display.

FIG. 3 depicts a vertical cross-sectional view of another liquid display element according to this invention. In FIG. 3, the same parts as those of FIG. 2 are referred by the same reference numerals thereby omitting the explanation thereof. As shown in this FIG., according to this liquid crystal display, a color filter 10 comprising a colored layer composed of organic silicon compound film colored in R, G and B on their predetermined regions is formed on the side of the transparent substrate $11_1$ mounted with TFT 13. Specifically, a passivation film 21, the color filter 10, an adhesion layer 22 and a transparent electrode $12_1$ are laminated in this order over the TFT 13. The transparent electrode $12_1$ is connected to the drain electrode 18 of TFT 13 through contact holes formed in each of the passivation film 21, the color filter 10 and the adhesion layer 22. Furthermore, a pair of electrodes $23_1$ and $23_2$ for assuring the supplementary capacity are disposed in separate to the TFT 13, wherein the electrode $23_2$ is connected to the transparent electrode $12_1$ through contact holes formed in each of the passivation film 21, the color filter 10 and the adhesion layer 22.

When the color filter 10 in FIG. 3 is to be formed according to the manufacturing method of the colored material of this invention, the process of light-exposure and coloring should preferably be repeated excluding the portion of the contact hole of the color filter 10 thereby forming each of the colored regions colored in R, G and B. Namely, since only the regions of organic silicon compound film which have been undergone with light-exposure and coloring are selectively turned into three-dimensional structure at this moment, it is possible, without employing a photolithographic technique using a photoresist, to easily make a contact hole by depolymerizing the organic polysilane existing in a region which is not yet turned into three-dimensional structure, and then by developing and removing the depolymerized portion by using an organic solvent.

In the above embodiments, the colored material of this invention is applied to a color filter for use in a liquid crystal element of an active matrix type display. However, it is also possible to apply the colored material of this invention to a liquid crystal element of other simple matrix types. Further, the color filter as explained above may be utilized also in various fields such for example as a solid-state image sensor other than a liquid crystal display.

This invention will be further explained with reference to the following examples. Before preparing a colored material of this invention, an organic polysilane to be employed in the examples was manufactured as follows.

(Synthesis of organic polysilane AZr)

60 ml of dried diethyl ether and 5.34 g of zirconocene dichlol were mixed together at a temperature of −20° C. in an argon atmosphere, and then 1.5M of methyl lithium was added little by little to the resultant solution over 70 minutes with stirring. After further stirring the mixture for 30 minutes at a temperature of 0° C., the diethyl ether was removed thereby obtaining a white solid which was then sublimated to obtain zirconocene dimethyl.

Subsequently, this zirconocene dimethyl was added to phenyl silane at a ratio of 50:1 molar ratio to allow the phenyl silane to be polymerized at room temperature over 5 hours. Then, this raw polymer was dissolved in toluene and then poured into methanol with stirring thus allowing the polymer to re-precipitate. After repeating twice this re-precipitation of the polymer in methanol, the polymer was dried under a reduced pressure at a temperature of 80° to 90° C. thereby obtaining an organic polysilane AZr having a weight-average molecular weight of 6,000 and represented by the following chemical formula.

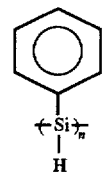

in this chemical formula (AZr), n represents a polymerization degree.

(Synthesis of organic polysilane BZr)

10 g of the organic polysilane AZr produced above and 15.5 g of azobis(isobutyronitrile) were dissolved in 50 g of acetone and refluxed for 3 days thereby allowing 50% of hydrogen atoms connected with silicon atom to be substituted with isopropyl group, thereby obtaining an organic polysilane BZr having a weight-average molecular weight of 6,000 and represented by the following chemical formula.

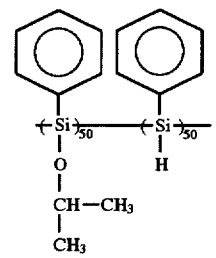

(Synthesis of organic polysilane CNa)

10 g of methyl dichlorosilane and 16.6 g of methylphenyl dichlorosilane were dissolved in toluene to prepare 50 wt. % toluene solution. On the other hand, 8.4 g of metallic Na fine pieces was dissolved in 100 ml of toluene in 1 litter flask. Then, 50 wt. % toluene solution prepared above was dripped little by little into the flask at a temperature of 110° C. After stirring the resultant solution for two hours, the temperature of the solution was lowered to room temperature and filtered in an argon atmosphere, the resultant filtrate being subsequently concentrated. The concentrated solution was then dripped in isopropyl alcohol to precipitate an organic polymer.

The organic polymer thus obtained was then vacuum-dried and dissolved again in toluene. After being washed with water, the resultant solution was dripped in isopropyl alcohol to refine the polymer. After repeating this refining process five times, the polymer was vacuum-dried to obtain an organic polysilane CNa having a weight-average molecular weight of about 12,000 and represented by the following chemical formula.

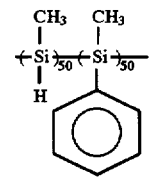

(Synthesis of organic polysilane DZr)

The same process as used for synthesizing the organic polysilane AZr was repeated except that phenyl silane was polymerized over 5 hours at a temperature of 100° C., thereby to obtain an organic polysilane DZr having the same repeating unit as that of the organic polysilane AZr and a weight-average molecular weight of about 7,000.

(Synthesis of organic polysilane ENa)

The same process as employed for synthesizing the organic polysilane CNa was repeated except that 10 g of methyl dichlorosilane, 10 g of methylphenyl dichlorosilane and 7.4 g of phenyltrichlorosilane were dissolved in toluene to prepare 50 wt. % toluene solution, thus obtaining an organic polysilane ENa having a weight-average molecular weight of about 15,000 and represented by the following chemical formula.

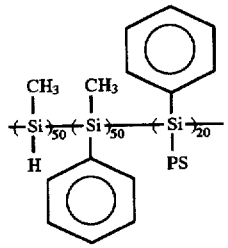

ENa

In this chemical formula, PS represents a polysilane skeleton.

(Synthesis of organic polysilane OCS) 10 g of polyphenyl silane having the same repeating unit as that of the organic polysilane AZr as mentioned above, a weight-average molecular weight of about 5,000 and a grass transition point of 45° C. and 5 g of benzoylperoxide was dissolved in 20 g of benzene. The resultant mixed solution was allowed to react for two hours at a temperature of 70° C. After removing insoluble residue through filtration, the reaction solution was concentrated and then precipitated in methanol to obtain an organic polysilane OCS represented by the following chemical formula and having a weight-average molecular weight of about 15,000 and a grass transition point of 75° C.

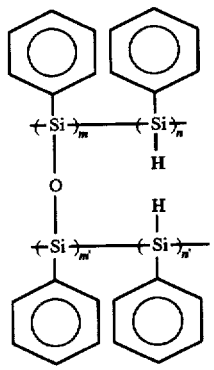

OCS

In this chemical formula OCS, m, m', n and n' respectively represents a polymerization degree.

(EXAMPLE I)

In this Example I, the organic polysilanes AZr, BZr, CNa, DZr and ENa synthesized as mentioned above were employed in a form of toluene solution to prepare colored materials.

(EXAMPLE I-1)

15 wt. % toluene solution of the organic polysilane AZr was spin-coated on a transparent substrate made of glass, and dried to obtain an organic silicon compound film having a thickness of about 2 μm. After being superimposed with a mask for color filter, the organic silicon compound film was irradiated with ultraviolet rays of 1 J/cm² by way of a low pressure mercury lamp. Subsequently, the organic silicon compound film was immersed in a 10 wt. % aqueous solution of acetonitrile containing as a color component 1 wt. % of Victoria Blue BH (Hodogaya Kagaku Co., Ltd., a triphenylmethane-based dyestuff) at a temperature of 25° C. for 5 minutes. After being washed with water, the silicon compound film was heat-dried at a temperature of 100° C. for 30 minutes, finding that the ultraviolet ray-irradiated region of the film was colored in blue.

Then, a mask was shifted to superimpose it on the organic silicon compound film so as to cover the region colored in blue, and the irradiation of ultraviolet rays was repeated in the same manner as explained above. Subsequently, the organic silicon compound film was immersed in a 10 wt. % aqueous solution of acetonitrile containing as a color component 1 wt. % of Astraphloxine FF (Hodogaya Kagaku Co., Ltd., a methine-based dyestuff) at a temperature of 25° C. for 2 minutes. After being washed with water, the silicon compound film was heat-dried at a temperature of 100° C. for 30 minutes, thus obtaining an organic silicon compound film having a prescribed region thereof being colored in blue and red.

Then, a mask was again shifted to superimpose it on a prescribed region of the organic silicon compound film, and the irradiation of ultraviolet rays was repeated in the same manner as explained above. Subsequently, the organic silicon compound film was immersed in a 10 wt. % aqueous solution of acetonitrile containing as a color component 0.5 wt. % of Brilliant basic cyanine 6GH (Hodogaya Kagaku Co., Ltd., a triphenyl methane-based dyestuff) and 0.7 wt. % of Yellow 7GLH (Hodogaya Kagaku Co., Ltd., a methine-based dyestuff) at a temperature of 25° C. for 10 minutes. After being washed with water, the silicon compound film was heat-dried at a temperature of 100° C. for 30 minutes, thus obtaining an organic silicon compound film having a prescribed region thereof being colored in red (R), blue (B) and green (G), thus obtaining a colored material of this invention.

Then, the chemical resistance of this colored material of this invention to toluene, ethanol, dimethylacetamide and butyrolactone was investigated to evaluate the durability of the colored material of this invention. As a result, the elution of color components was not recognized even if this colored material was immersed in these organic solvents, and any peeling of the colored layer from the transparent substrate was not recognized, thus demonstrating a sufficient fixing of colored layer on the film. Furthermore, the light-transmittance of each colored region, R, G and B of the colored layer was found to be 2%, 1.5% and 1.8%, respectively, indicating an excellency in light-transmittance. When the colored layer was dissolved in a 10 wt. % aqueous solution of NaOH and, after being turned into a weak acidic solution by the addition of sodium bicarbonate, the resultant solution was extracted with ether and then analyzed using a high speed liquid chromatography. As a result, 98 atomic % or more of silicon atoms in all of the silicon-based matrix forming the organic silicon compound film was found to be a silicon atom having one Si—C bond.

(EXAMPLE I-2)

A colored material was prepared in the same manner as explained in Example I-1 except that after coloring prescribed regions of an organic silicon compound film were colored in R, G and B respectively and washed with water, and then heat-dried for 30 minutes at a temperature of 150° C. Then, the chemical resistance of this colored material to toluene, ethanol, dimethylacetamide and butyrolactone was investigated. As a result, the elution of color components was not recognized even if this colored material was immersed in these organic solvents, and any peeling of the colored layer from the transparent substrate was not recognized, thus demonstrating a sufficient fixing of colored layer on the film and an excellent durability of the colored layer.

(Comparative Example I-1)

A colored material was prepared in the same manner as explained in Example I-1 except that phenylmethyl polysilane having a weight-average molecular weight of 6,000 and represented by the following chemical formula was employed in place of the organic polysilane AZr, thus obtaining a colored layer. The light-transmittance of each colored region, R, G and B of the colored layer was found to be about 30 to 40% in any of the regions, indicating a poor light-transmittance.

Likewise, a colored material was prepared in the same manner as explained in Example I-2 except that phenylmethyl polysilane having a weight-average molecular weight of 6,000 and represented by the following chemical formula was employed in place of the organic polysilane AZr, thus obtaining a colored layer. When this colored material was immersed in each of toluene, ethanol, dimethylacetamide and butyrolactone, the colored layer was peeled off from the transparent substrate and swelling of the colored layer was recognized, thus demonstrating a poor durability of the colored layer.

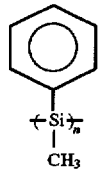

wherein n represents a polymerization degree.

When the colored layer was dissolved in a 10 wt. % aqueous solution of NaOH and, after being turned into a weak acidic solution by the addition of sodium bicarbonate, the resultant solution was extracted with ether and then analyzed using a high speed liquid chromatography. As a result, the content of silicon atoms having one Si—C bond in all of the silicon-based matrix forming the organic silicon compound film was found to be lower than the detection limit.

(EXAMPLE I-3)

15 wt. % toluene solution of the organic polysilane BZr was spin-coated on a transparent substrate made of glass, and dried to obtain an organic silicon compound film having a thickness of about 1.5 μm. After being superimposed with a mask for color filter, the organic silicon compound film was irradiated with ultraviolet rays of 1.2 J/cm² by way of a low pressure mercury lamp. Subsequently, the organic silicon compound film was immersed in a 10 wt. % aqueous solution of acetonitrile containing as a color component 1 wt. % of Victoria Blue BH (Hodogaya Kagaku Co., Ltd., a triphenylmethane-based dyestuff) at a temperature of 25° C. for 5 minutes. After being washed with water, the silicon compound film was heat-dried at a temperature of 100° C. for 30 minutes, finding that the ultraviolet ray-irradiated region of the film was colored in blue.

Then, a mask was shifted to superimpose it on the organic silicon compound film so as to cover the region colored in blue, and the irradiation of ultraviolet rays was repeated in the same manner as explained above. Subsequently, the organic silicon compound film was immersed in a 10 wt. % aqueous solution of acetonitrile containing as a color component 1 wt. % of Astraphloxine FF (Hodogaya Kagaku Co., Ltd., a methine-based dyestuff) at a temperature of 25° C. for 2 minutes. After being washed with water, the silicon compound film was heat-dried at a temperature of 100° C. for 30 minutes, thus obtaining an organic silicon compound film having a prescribed region thereof being colored in blue and red.

Then, a mask was again shifted to superimpose it on a prescribed region of the organic silicon compound film, and the irradiation of ultraviolet rays was repeated in the same manner as explained above. Subsequently, the organic silicon compound film was immersed in a 10 wt. % aqueous solution of acetonitrile containing as a color component 0.5 wt. % of Brilliant basic cyanine 6GH (Hodogaya Kagaku Co., Ltd., a triphenyl methane-based dyestuff) and 0.7 wt. % of Yellow 7GLH (Hodogaya Kagaku Co., Ltd., a methine-based dyestuff) at a temperature of 25° C. for 10 minutes. After being washed with water, the silicon compound film was heat-dried at a temperature of 100° C. for 30 minutes, thus obtaining an organic silicon compound film having a prescribed region thereof being colored in red (R), blue (B) and green (G), thus obtaining a colored material of this invention.

The colored layer thus obtained was found to be free from any stripping of colors, and any of R, G and B were fully colored. When this colored material of this invention was immersed, after being heated at a temperature of 150° C. for 30 minutes, into each of toluene, ethanol, dimethylacetamide and butyrolactone, the elution of color components was not recognized, and any peeling of the colored layer from the transparent substrate was not recognized, thus demonstrating a sufficient fixing strength of colored layer on the film and an excellent durability of the colored layer. Furthermore, the colored layer was dissolved in a 10 wt. % aqueous solution of NaOH and, after being turned into a weak acidic solution by the addition of sodium bicarbonate, the resultant solution was extracted with ether for analyzing it using a high speed liquid chromatography. As a result, 98 atomic % or more of silicon atoms in all of the silicon-based matrix forming the organic silicon compound film was found to be a silicon atom having one Si—C bond.

(EXAMPLES I-4 to I-6)

A plurality of colored materials were prepared in the same manner as explained in Example I-3 except that organic polysilanes CNa, DZr and ENa were employed in place of the organic polysilane BZr, thus obtaining colored materials of Examples I-4 to I-6. These colored layers thus obtained were found to be free from any stripping of colors, and any of R, G and B were fully colored. When these colored materials of this invention were immersed into each of toluene, ethanol, dimethylacetamide and butyrolactone, the elution of color components was not recognized, and any peeling of the colored layer from any of the transparent substrates was not recognized, thus demonstrating a sufficient fixing strength of colored layers on the films and an excellent durability of these colored layers. Furthermore, these colored layers were dissolved respectively in a 10 wt. % aqueous solution of NaOH and, after being turned into a weak acidic solution by the addition of sodium bicarbonate, the resultant solution was extracted with ether for analyzing it using a high speed liquid chromatography. As a result, about 49 atomic % of silicon atoms in all of the silicon-based matrix forming the organic silicon compound film was found to be a silicon atom having one Si—C bond in the case of Example I-4. Likewise, the content of the silicon atom having one Si—C bond was about 98 atomic % in the case of Example I-5, and the content of the silicon atom having one Si—C bond was about 68 atomic % in the case of Example I-6.

(EXAMPLES I-7)

50 g of tetraethoxy silane, 40 g of acetonitrile and 50 g of water were mixed together, and then 0.1 g of hydrochloric acid to obtain a colloidal solution of tetraethoxy silane. Then, an organic silicon compound film whose prescribed regions were colored in R, G and B respectively was prepared in the same manner as explained in Example I-1 except that the heat-drying at a temperature of 100° C. for 30 minutes was omitted, thus obtaining colored organic silicon compound film. This colored organic silicon compound film was then immersed in the colloidal solution and dried for one hour at a temperature of 150° C. to prepare a colored material of this invention. When this colored material was then immersed into each of toluene, ethanol, dimethylacetamide and butyrolactone, the elution of color components was not recognized, and any peeling of the colored layer from the transparent substrate was not recognized, thus demonstrating a sufficient fixing strength of colored layers on the films and an excellent durability of these colored layers. Further, when the surface hardness of the colored layer was measured by way of a pencil scratch test (JIS-K5401), the hardness of the colored layer was found to be 5H, indicating a sufficient mechanical strength.

(EXAMPLES I-8)

A colored material was prepared in the same manner as in the case of Examples I-7 except that a solution comprising 20 g of tetravinyl silane and 1 g of chloroplatinic acid as polymerizing catalyst thereof in 80 g of toluene was employed in place of the colloidal solution. When this colored material was then immersed into each of toluene, ethanol, dimethylacetamide and butyrolactone, the elution of color components was not recognized, and any peeling of the colored layer from the transparent substrate was not recognized, thus demonstrating a sufficient fixing strength of colored layers on the films and an excellent durability of these colored layers. Further, when the surface hardness of the colored layer was measured by way of a pencil scratch test (JIS-K5401), the hardness of the colored layer was found to be 5H, indicating a sufficient mechanical strength.

(EXAMPLES I-9)

50 g of tetraethoxy silane, 40 g of acetonitrile and 50 g of water were mixed together, and, after the addition of PR238 (Sanyo Shikiso Co. Ltd., a pigment) as a color component to the resultant mixed solution, the color component was dispersed while adding 0.1 g of hydrochloric acid to the solution over 5 hours. Then, an organic silicon compound film composed mainly of the organic polysilane AZr was prepared in the same manner as in the case of Example I-1, and then irradiated with ultraviolet rays of 1 J/cm² by way of a low pressure mercury lamp. Subsequently, the organic silicon compound film was immersed in the above-mentioned colloidal solution (sol solution) for 10 minutes at room temperature. After being washed with water, the silicon compound film was heat-dried at a temperature of 150° C. for 30 minutes, thereby forming a colored material of this invention provided with a colored layer of the organic silicon compound film which was colored in red all over the surface thereof. When this colored material was then immersed into each of toluene, ethanol, dimethylacetamide and butyrolactone, the elution of color components was not recognized, and any peeling of the colored layer from the transparent substrate was not recognized, thus demonstrating a sufficient fixing strength of colored layers on the films and an excellent durability of these colored layers.

(EXAMPLES I-10)

An ITO film was formed on the surface of the colored material prepared in Example I-1 by way of spattering, and then a solvent-soluble polyimide varnish was coated on the ITO film. Then, by successively subjecting the colored material to a heat treatment and a rubbing treatment, a color filter substrate provided on the colored layer thereof with a transparent electrode and a liquid crystal orientation film was obtained. On the other hand, a hard glass having on its surface a vapor-deposited ITO film as a transparent electrode was treated with a mixed solution of hydrogen peroxide and sulfuric acid, and then washed with water. Thereafter, the surface of the hard glass was dried first with a rinser dryer and then at a temperature of 150° C. for 30 minutes. After forming a TFT on this hard glass, a solvent-soluble polyimide varnish was coated on the TFT and ITO film, and then subjected successively to a heat treatment and a rubbing treatment, thereby obtaining an ITO-attached transparent substrate provided with TFT and a liquid crystal orientation film.

Then, these color filter and ITO-attached transparent substrate were disposed in such a manner that both of the liquid crystal orientation films as to face to each other through a spacer and to be kept apart at a distance of 5 μm. After being sealed, 6CB (4,4'-hexylcyanobiphenyl) as a liquid crystal was charged and sealed in a liquid crystal cell. When the voltage retention of the resultant liquid crystal display was measured at room temperature, a value of 95% was obtained indicating an excellent voltage retention.

(EXAMPLE II)

In this Example II, the organic polysilanes AZr, BZr, CNa, DZr, ENa and OCS synthesized as mentioned above were employed and at the same time a radical-generating agent was added therein to form colored materials.

(EXAMPLE II-1)

10 g of the organic polysilane AZr, 5 g of methacrylic bisphenol A type epoxy resin as an organic compound having an unsaturated bond and 4 g of AIBN as a radical-generating agent were dissolved into toluene to prepare a toluene solution containing 15 wt. % of solid matters. This toluene solution was spin-coated on a glass substrate, and dried at a temperature of 100° C. for 20 minutes to obtain an organic silicon compound film having a thickness of about 1 μm. The methacrylic bisphenol A type epoxy resin employed herein was a methacrylated Epicoat 807 (Shell Chemical Co. Ltd.). After being superimposed with a mask for color filter, the organic silicon compound film was irradiated with ultraviolet rays of 1 J/cm² by way of a low pressure mercury lamp. Subsequently, the organic silicon compound film was immersed in a 20 wt. % aqueous solution of acetonitrile containing as a color component 1 wt. % of Victoria Blue BH (Hodogaya Kagaku Co., Ltd., a triphenylmethane-based dyestuff) at a temperature of 25° C. for 3 minutes. After being washed with water, the silicon compound film was heat-dried at a temperature of 100° C.

for 30 minutes, finding that the ultraviolet ray-irradiated region of the film was colored in blue.

Then, a mask was shifted to superimpose it on the organic silicon compound film so as to cover the region colored in blue, and the irradiation of ultraviolet rays was repeated in the same manner as explained above. Subsequently, the organic silicon compound film was immersed in a 20 wt. % aqueous solution of acetonitrile containing as a color component 1 wt. % of Astraphloxine FF (Hodogaya Kagaku Co., Ltd., a methine-based dyestuff) at a temperature of 25° C. for 2 minutes. After being washed with water, the silicon compound film was heat-dried at a temperature of 100° C. for 30 minutes, thus obtaining an organic silicon compound film having a prescribed region thereof being colored in blue and red.

Then, a mask was again shifted to superimpose it on a prescribed region of the organic silicon compound film, and the irradiation of ultraviolet rays was repeated in the same manner as explained above. Subsequently, the organic silicon compound film was immersed in a 20 wt. % aqueous solution of acetonitrile containing as a color component 0.5 wt. % of Brilliant basic cyanine 6GH (Hodogaya Kagaku Co., Ltd., a triphenyl methane-based dyestuff) and 0.7 wt. % of Yellow 7GLH (Hodogaya Kagaku Co., Ltd., a methine-based dyestuff) at a temperature of 25° C. for 10 minutes. After being washed with water, the silicon compound film was heat-dried at a temperature of 100° C. for 30 minutes, thus obtaining an organic silicon compound film having a prescribed region thereof being colored in red (R), blue (B) and green (G), thus obtaining a colored material of this invention.

Then, the chemical resistance of this colored material of this invention to toluene, ethanol, dimethylacetamide and butyrolactone was investigated to evaluate the durability of the colored material of this invention. As a result, the elution of color components was not recognized even if this colored material was immersed in these organic solvents, and any peeling of the colored layer from the transparent substrate was not recognized, thus demonstrating a sufficient fixing of colored layer on the film. Furthermore, the light-transmittance of each colored region, R, G and B of the colored layer was found to be 2%, 1% and 1%, respectively, indicating an excellency in light-transmittance.

(EXAMPLE II-2)

A colored material was prepared in the same manner as explained in Example II-1 except that after coloring prescribed regions of an organic silicon compound film were colored in R, G and B respectively and washed with water, and then heat-dried for 30 minutes at a temperature of 150° C. Then, the chemical resistance of this colored material to toluene, ethanol, dimethylacetamide and butyrolactone was investigated. As a result, the elution of color components was not recognized even if this colored material was immersed in these organic solvents, and any peeling of the colored layer from the transparent substrate was not recognized, thus demonstrating a sufficient fixing of colored layer on the film and an excellent durability of the colored layer.

(Comparative Example II-1)

A colored material was prepared in the same manner as explained in Example II-1 except that phenylmethyl polysilane having a weight-average molecular weight of 6,000 and represented by the following chemical formula was employed in place of the organic polysilane AZr, thus obtaining a colored layer. The light-transmittance of each colored region, R, G and B of the colored layer was found to be about 30 to 40% in any of the regions, indicating a poor light-transmittance.

Likewise, a colored material was prepared in the same manner as explained in Example II-2 except that phenylmethyl polysilane having a weight-average molecular weight of 6,000 and represented by the following chemical formula was employed in place of the organic polysilane AZr, thus obtaining a colored layer. When this colored material was immersed in each of toluene, ethanol, dimethylacetamide and butyrolactone, the colored layer was peeled off from the transparent substrate and swelling of the colored layer was recognized, thus demonstrating a poor durability of the colored layer.

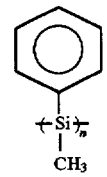

wherein n represents a polymerization degree.

(EXAMPLE II-3)

10 g of the organic polysilane BZr, 5 g of dicumylperoxide as a radical-generating agent and 5 g of ethylene glycol dimethacrylate as an organic compound having an unsaturated bond were dissolved into toluene to prepare a toluene solution containing 15 wt. % of solid matters. This toluene solution was spin-coated on a glass substrate, and dried at a temperature of 150° C. for 30 minutes to obtain an organic silicon compound film having a thickness of about 1.5 µm. After being superimposed with a mask for color filter, the organic silicon compound film was irradiated with ultraviolet rays of 1.2 J/cm$^2$ by way of a low pressure mercury lamp. Subsequently, the organic silicon compound film was immersed in a 30 wt. % aqueous solution of acetonitrile containing as a color component 1 wt. % of Victoria Blue BH (Hodogaya Kagaku Co., Ltd., a triphenylmethane-based dyestuff) at a temperature of 25° C. for 3 minutes. After being washed with water, the silicon compound film was heat-dried at a temperature of 100° C. for 30 minutes, finding that the ultraviolet ray-irradiated region of the film was colored in blue.

Then, a mask was shifted to superimpose it on the organic silicon compound film so as to cover the region colored in blue, and the irradiation of ultraviolet rays was repeated in the same manner as explained above. Subsequently, the organic silicon compound film was immersed in a 30 wt. % aqueous solution of acetonitrile containing as a color component 1 wt. % of Astraphloxine FF (Hodogaya Kagaku Co., Ltd., a methine-based dyestuff) at a temperature of 25° C. for 2 minutes. After being washed with water, the silicon compound film was heat-dried at a temperature of 100° C. for 30 minutes, thus obtaining an organic silicon compound film having a prescribed region thereof being colored in blue and red.

Then, a mask was again shifted to superimpose it on a prescribed region of the organic silicon compound film, and the irradiation of ultraviolet rays was repeated in the same manner as explained above. Subsequently, the organic silicon compound film was immersed in a 30 wt. % aqueous solution of acetonitrile containing as a color component 0.5 wt. % of Brilliant basic cyanine 6GH (Hodogaya Kagaku Co., Ltd., a triphenyl methane-based dyestuff) and 0.7 wt. % of Yellow 7GLH (Hodogaya Kagaku Co., Ltd., a methine-based dyestuff) at a temperature of 25° C. for 10 minutes. After being washed with water, the silicon compound film was heat-dried at a temperature of 100° C. for 30 minutes, thus obtaining an organic silicon compound film having a prescribed region thereof being colored in red (R), blue (B) and green (G), thus obtaining a colored material of this invention.

The colored layer thus obtained was found to be free from any stripping of colors, and any of R, G and B were fully colored. When this colored material of this invention was immersed, after being heated at a temperature of 150° C. for 30 minutes, into each of toluene, ethanol, dimethylacetamide and butyrolactone, the elution of color components was not recognized, and any peeling of the colored layer from the transparent substrate was not recognized, thus demonstrating a sufficient fixing strength of colored layer on the film and an excellent durability of the colored layer.

(EXAMPLES II-4 to II-7)

A plurality of colored materials were prepared in the same manner as explained in Example II-3 except that organic polysilanes CNa, DZr, ENa and OCS were employed in place of the organic polysilane BZr, thus obtaining colored materials of Examples II-4 to II-7. These colored layers thus obtained were found to be free from any stripping of colors, and any of R, G and B were fully colored. When these colored materials of this invention were immersed, after being heated at a temperature of 150° C. for 30 minutes, into each of toluene, ethanol, dimethylacetamide and butyrolactone, the elution of color components was not recognized, and any peeling of the colored layer from any of the transparent substrates was not recognized, thus demonstrating a sufficient fixing strength of colored layers on the films and an excellent durability of these colored layers.

(EXAMPLES II-8)

50 g of tetraethoxy silane, 40 g of acetonitrile and 50 g of water were mixed together, and then 0.1 g of hydrochloric acid to obtain a colloidal solution of tetraethoxy silane. Then, an organic silicon compound film whose prescribed regions were colored in R, G and B respectively was prepared in the same manner as explained in Example II-1 except that the heat-drying at a temperature of 100° C. for 30 minutes was omitted, thus obtaining colored organic silicon compound film. This colored organic silicon compound film was then immersed in the colloidal solution and dried for one hour at a temperature of 150° C. to prepare a colored material of this invention. When this colored material was then immersed into each of toluene, ethanol, dimethylacetamide and butyrolactone, the elution of color components was not recognized, and any peeling of the colored layer from the transparent substrate was not recognized, thus demonstrating a sufficient fixing strength of colored layers on the films and an excellent durability of these colored layers. Further, when the surface hardness of the colored layer was measured by way of a pencil scratch test (JIS-K5401), the hardness of the colored layer was found to be 5H, indicating a sufficient mechanical strength.

(EXAMPLES II-9)

A colored material was prepared in the same manner as in the case of Examples II-8 except that a solution comprising 20 g of tetravinyl silane and 1 g of chloroplatinic acid as polymerizing catalyst in 80 g of toluene was employed in place of the colloidal solution. When this colored material was then immersed into each of toluene, ethanol, dimethylacetamide and butyrolactone, the elution of color components was not recognized, and any peeling of the colored layer from the transparent substrate was not recognized, thus demonstrating a sufficient fixing strength of colored layers on the films and an excellent durability of these colored layers. Further, when the surface hardness of the colored layer was measured by way of a pencil scratch test (JIS-K5401), the hardness of the colored layer was found to be 5H, indicating a sufficient mechanical strength.

(EXAMPLES II-10)

50 g of tetraethoxy silane, 40 g of acetonitrile and 50 g of water were mixed together, and, after the addition of PR238 (Sanyo Shikiso Co. Ltd., a pigment) as a color component to the resultant mixed solution, the color component was dispersed while adding 0.1 g of hydrochloric acid to the solution over 5 hours. Then, an organic silicon compound film composed mainly of the organic polysilane AZr was prepared in the same manner as in the case of Example II-1, and then irradiated with ultraviolet rays of 1 J/cm$^2$ by way of a low pressure mercury lamp. Subsequently, the organic silicon compound film was immersed in the above-mentioned colloidal solution (sol solution) for 10 minutes at room temperature. After being washed with water, the silicon compound film was heat-dried at a temperature of 150° C. for 30 minutes, thereby forming a colored material of this invention provided with a colored layer of the organic silicon compound film which was colored in red all over the surface thereof. When this colored material was then immersed into each of toluene, ethanol, dimethylacetamide and butyrolactone, the elution of color components was not recognized, and any peeling of the colored layer from the transparent substrate was not recognized, thus demonstrating a sufficient fixing strength of colored layers on the films and an excellent durability of these colored layers.

(EXAMPLES II-11)

An ITO film was formed on the surface of the colored material prepared in Example II-1 by way of spattering, and then a solvent-soluble polyimide varnish was coated on the ITO film. Then, by successively subjecting the colored material to a heat treatment and a rubbing treatment, a color filter substrate provided on the colored layer thereof with a transparent electrode and a liquid crystal orientation film was obtained. On the other hand, a hard glass having on its surface a vapor-deposited ITO film as a transparent electrode was treated with a mixed solution of hydrogen peroxide and sulfuric acid, and then washed with water. Thereafter, the surface of the hard glass was dried first with a rinser dryer and then at a temperature of 150° C. for 30 minutes. After forming a TFT on this hard glass, a solvent-soluble polyimide varnish was coated on the TFT and ITO film, and then subjected successively to a heat treatment and a rubbing treatment, thereby obtaining an ITO-attached transparent substrate provided with TFT and a liquid crystal orientation film.

Then, these color filter and ITO-attached transparent substrate were disposed in such a manner that both of the liquid crystal orientation films as to face to each other through a spacer and to be kept apart at a distance of 5 μm. After being sealed, 6CB (4,4'-hexylcyanobiphenyl) as a liquid crystal was charged and sealed in a liquid crystal cell. When the voltage retention of the resultant liquid crystal display was measured at room temperature, a value of 95% was obtained indicating an excellent voltage retention.

(EXAMPLE II-12)

10 g of the organic polysilane AZr and 5 g of benzoylperoxide as a radical-generating agent were dissolved into 20 g of toluene to prepare a toluene solution. This toluene solution was spin-coated on a glass substrate, and dried at a temperature of 100° C. for 20 minutes to obtain an organic silicon compound film having a thickness of about 1 μm. After being superimposed with a mask for color filter, the organic silicon compound film was irradiated with ultraviolet rays of 1 J/cm² by way of a low pressure mercury lamp. Subsequently, the organic silicon compound film was immersed in a 20 wt. % aqueous solution of acetonitrile containing as a color component 1 wt. % of Victoria Blue BH (Hodogaya Kagaku Co., Ltd., a triphenylmethane-based dyestuff) at a temperature of 25° C. for 3 minutes. After being washed with water, the silicon compound film was heat-dried at a temperature of 100° C. for 30 minutes, finding that the ultraviolet ray-irradiated region of the film was colored in blue.

Then, a mask was shifted to superimpose it on the organic silicon compound film so as to cover the region colored in blue, and the irradiation of ultraviolet rays was repeated in the same manner as explained above. Subsequently, the organic silicon compound film was immersed in a 20 wt. % aqueous solution of acetonitrile containing as a color component 1 wt. % of Astraphloxine FF (Hodogaya Kagaku Co., Ltd., a methine-based dyestuff) at a temperature of 25° C. for 2 minutes. After being washed with water, the silicon compound film was heat-dried at a temperature of 100° C. for 30 minutes, thus obtaining an organic silicon compound film having a prescribed region thereof being colored in blue and red.

Then, a mask was again shifted to superimpose it on a prescribed region of the organic silicon compound film, and the irradiation of ultraviolet rays was repeated in the same manner as explained above. Subsequently, the organic silicon compound film was immersed in a 20 wt. % aqueous solution of acetonitrile containing as a color component 0.5 wt. % of Brilliant basic cyanine 6GH (Hodogaya Kagaku Co., Ltd., a triphenyl methane-based dyestuff) and 0.7 wt. % of Yellow 7GLH (Hodogaya Kagaku Co., Ltd., a methine-based dyestuff) at a temperature of 25° C. for 10 minutes. After being washed with water, the silicon compound film was heat-dried at a temperature of 100° C. for 30 minutes, thus obtaining an organic silicon compound film having a prescribed region thereof being colored in red (R), blue (B) and green (G), thus obtaining a colored material of this invention.

Then, the chemical resistance of this colored material of this invention to toluene, ethanol, dimethylacetamide and butyrolactone was investigated to evaluate the durability of the colored material of this invention. As a result, the elution of color components was not recognized even if this colored material was immersed in these organic solvents, and any peeling of the colored layer from the transparent substrate was not recognized, thus demonstrating a sufficient fixing of colored layer on the film. Furthermore, the light-transmittance of each colored region, R, G and B of the colored layer was found to be 3%, 1% and 2%, respectively, indicating an excellency in light-transmittance.

As explained above, it is possible according to the present invention to provide a colored material such as a color filter which can be manufactured in a simple process within a short period of time and is highly refined and excellent in durability and mechanical strength. Accordingly, the colored material of this invention would be very suited for use in a liquid crystal display for a full color display device, and therefore is very valuable in industrial view point.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A colored material provided with a colored layer comprising a silicon-based matrix, comprised of a photo-oxidized organic polysilane and containing a coloring component wherein the number of silicon atom bonded through only one of its bonds to an organic residual group is 5 atomic % or more based on total number of silicon atoms in the silicon-based matrix.

2. The colored material according to claim 1, wherein said colored layer comprises a plurality of colored regions, each region containing a color component which is different from those contained in other regions.

3. The colored material according to claim 2, wherein said colored material is a color filter.

4. The colored material according to claim 2, wherein said colored regions are either red, green, or blue.

5. The colored material according to claim 1, wherein said silicon-based matrix comprises a three-dimensional structure composed of Si—O—Si bond.

6. The colored material according to claim 5, wherein the number of said silicon atoms whose three bonds are offered to said Si—O—Si bond and whose one bond is offered to Si—C bond is 5 atomic % or more, based on total number of silicon atoms in the silicon-based matrix.

7. A method of manufacturing a colored material which comprises the steps of:

forming a film of an organic silicon compound comprised of organic polysilane containing 5% or more of any one of repeating units represented by the following general formulas (1) to (3);

wherein R¹ is a substituted or non-substituted hydrocarbon group; R² is a substituted or non-substituted hydrocarbon group or acyl group; and R³ is a substituted or non-substituted silyl group or polysilane skeleton;

irradiating a prescribed portion of the organic silicon compound film with ultraviolet rays;

coloring the irradiated portion of the organic silicon compound film by immersing the organic silicon compound film in a solution containing a color component; and heat-drying the organic silicon compound film, thereby converting the colored portion of the organic silicon compound film into a three-dimensional structure.

8. The method according to claim 7, wherein said organic silicon compound film is further immersed, after the immersion thereof in said solution containing a color component, in a colloidal solution containing at least one compound selected from the group consisting of metallic alkoxide and decomposition products of said metallic alkoxide.

9. The method according to claim 7, wherein the step of immersing said organic silicon compound film in a solution containing a color component is performed by immersing said organic silicon compound film in a colloidal solution containing said color component and at least one compound selected from the group consisting of metallic alkoxide and decomposition products of said metallic alkoxide.

10. The method according to claim 7, wherein the step of forming said organic silicon compound film is performed by coating a solution of an organic polysilane composition comprising an organic polysilane having a repeating unit represented by the general formula (1) and a radical-generating agent on a substrate, and then heat-drying the coated film.

11. The method according to claim 10, wherein said organic polysilane composition further comprises an organic compound having at least two unsaturated bonds in its molecule.

12. The method according to claim 10, wherein said $R^1$ is selected from the group consisting of substituted or non-substituted phenyl, naphthyl, phenanthryl and anthranil group.

13. The method according to claim 7, wherein said irradiating step and said coloring step comprise:

a first light-exposure step of irradiating ultraviolet rays onto a first region of the organic silicon compound film;

a first coloring step of immersing the organic silicon compound film in a solution containing a first color component after said first light-exposure step;

a second light-exposure step of irradiating ultraviolet rays onto a second region of the organic silicon compound film; and a second coloring step of immersing the organic silicon compound film in a solution containing a second color component after said second light-exposure step.

14. The method according to claim 13, wherein said colored material is a color filter.

15. A liquid crystal display which comprises: a pair of transparent substrates facing each other; a pair of transparent electrodes, each disposed on a main surface of each of the transparent substrates so as to face each other; a liquid crystal between the pair of transparent substrates with each of the electrodes interposed therebetween; and a color filter interposed between one of the transparent substrate and the transparent electrode formed on the main surface of said one of the transparent substrate;

wherein said color filter is formed of a colored material provided with a colored layer comprising a silicon-based matrix comprised of a photo-oxidized organic polysilane and containing a coloring component, said silicon-based matrix containing 5 atomic % or more of silicon atoms bonded through only one of its bonds to an organic residual group, based on the total number of silicon atoms in the silicon-based matrix.

16. The liquid crystal display according to claim 15, wherein said colored layer of the color filter comprises a plurality of regions colored in different colors of red (R), blue (B) and green (G).

* * * * *